(12) United States Patent
Liu et al.

(10) Patent No.: US 6,656,591 B2
(45) Date of Patent: Dec. 2, 2003

(54) DIAMOND-COATED BODY INCLUDING INTERFACE LAYER INTERPOSED BETWEEN SUBSTRATE AND DIAMOND COATING, AND METHOD OF MANUFACTURING THE SAME

(75) Inventors: Hao Liu, Toyokawa (JP); Yoshihiko Murakami, Toyohashi (JP); Hiroyuki Hanyu, Toyokawa (JP)

(73) Assignee: OSG Corporation, Toyokawa (JP)

( * ) Notice: Subject to any disclaimer, the term of this patent is extended or adjusted under 35 U.S.C. 154(b) by 81 days.

(21) Appl. No.: 09/960,375

(22) Filed: Sep. 24, 2001

(65) Prior Publication Data

US 2002/0071949 A1 Jun. 13, 2002

(30) Foreign Application Priority Data

Dec. 11, 2000 (JP) ........................................ 2000-375918

(51) Int. Cl.[7] .................................................. B32J 9/00
(52) U.S. Cl. ........................ 428/408; 428/156; 428/174; 428/325; 428/336; 428/697; 428/698; 428/699
(58) Field of Search ................................ 428/408, 698, 428/697, 699, 325, 336, 174, 156

(56) References Cited

FOREIGN PATENT DOCUMENTS

| JP | 62-7267 | B2 |   | 2/1987  |
|----|---------|----|---|---------|
| JP | 503822  |    | * | 9/1992  |
| JP | 5-78845 | A  |   | 3/1993  |
| JP | 5-230656| A  |   | 9/1993  |
| JP | 5-263251| A  |   | 10/1993 |
| JP | 5-279855| A  |   | 10/1993 |
| JP | 6-951   | B2 |   | 1/1994  |
| JP | 6-346241| A  |   | 12/1994 |
| JP | 7-108404| A  |   | 4/1995  |
| JP | 8-232067| A  |   | 9/1996  |
| JP | 11-510858| A |   | 9/1999  |

OTHER PUBLICATIONS

English abstract of JP 62–196371.*
English abstract of JP 58–126972.*
"Adhesion of Diamond Film To Substrate" Toshiba Review; vol. 46, No. 1; 1991; pp. 72–74.
"Diamond Nucleation And Growth Of Different Cutting Tool Materials: Influence Of Substrate Pre–Treatments" by E. Cappelli et al.; Diamond and Related Materials 5; 1996; pp. 292–298.
"Morphologies And Adhesion Strength Of Diamond Films Deposited On WC–6% Co Cemented Carbides With Different Surface Characteristics" by Peng XiLing et al.; Thin Solid Films, 239; 1994; pp. 47–50.

* cited by examiner

*Primary Examiner*—Archene Turner
(74) *Attorney, Agent, or Firm*—Oliff & Berridge, PLC

(57) ABSTRACT

A diamond-coated body including: a substrate formed of a cemented carbide; a diamond coating; and an interface layer interposed between the substrate and the diamond coating, wherein the interface layer consists of a solid solution including an aluminum nitride and a metal which belongs to one of groups IVa, Va and VIa of the periodic table. The interface layer is preferably provided by one of TiAlN, CrAlN and VAlN. The substrate is preferably formed of a super-fine particle cemented carbide.

9 Claims, 7 Drawing Sheets

FIG. 4

| SAMPLE No. | MATERIAL OF SUBSTRATE | COATING | TREATMENT FOR SUBSTRATE | THICKNESS OF DIAMOND COATING |
|---|---|---|---|---|
| 1 | SUPER-FINE PARTICLE CEMENTED CARBIDE | TiAlN INTERFACE LAYER + DIAMOND COATING | ELECTROLYTIC POLISHING | 10 μm |
| 2 | SUPER-FINE PARTICLE CEMENTED CARBIDE | TiAlN INTERFACE LAYER + DIAMOND COATING | SiC BLASTING | 10 μm |
| 3 | ORDINARY CEMENTED CARBIDE | TiAlN INTERFACE LAYER + DIAMOND COATING | SiC BLASTING | 10 μm |
| 4 | ORDINARY CEMENTED CARBIDE | TiAlN INTERFACE LAYER + DIAMOND COATING | SiC BLASTING | 14 μm |
| 5 | ORDINARY CEMENTED CARBIDE | DIAMOND COATING | ELECTROLYTIC POLISHING + ACID TREATMENT | 10 μm |
| 6 | SUPER-FINE PARTICLE CEMENTED CARBIDE | DIAMOND COATING | ELECTROLYTIC POLISHING + ACID TREATMENT | 10 μm |

FIG. 5

| WORKPIECE | CUTTING MODE | CUTTING FLUID | CUTTING VELOCITY | FEED RATE | DEPTH OF CUT |
|---|---|---|---|---|---|
| A7075 | SIDE FACE CUTTING | WATER SOLUBLE FLUID | 200m/min | 0.05~0.2mm/tooth | a a = 1.0D<br>a r = 0.1D |
| A7075 | SLOT CUTTING | WATER SOLUBLE FLUID | 200m/min | 0.025~0.2mm/tooth | a a = 0.5D<br>a r = 1.0D |
| ADC12 | SIDE FACE CUTTING | WATER SOLUBLE FLUID | 200m/min | 0.05~0.075mm/tooth | a a = 1.0D<br>a r = 0.1D |

DIAMOND-COATED BODY INCLUDING INTERFACE LAYER INTERPOSED BETWEEN SUBSTRATE AND DIAMOND COATING, AND METHOD OF MANUFACTURING THE SAME

BACKGROUND OF THE INVENTION

1. Field of the Invention

The present invention relates in general to a diamond-coated body, and more particularly to such a diamond-coated body in which a diamond coating is fixed to a substrate with a sufficiently high strength even where the substrate is made of a super-fine particle cemented carbide with a high Co content, and also to a method of manufacturing the same.

2. Discussion of the Related Art

As one type of a cutting tool such as an end mill, a tap and a drill, there is proposed a diamond-coated cutting tool in which a tool substrate made of a cemented carbide is coated with a diamond coating. In a process of formation of the diamond coating on the tool substrate in accordance with a CVD (chemical vapor deposition) method or other method, at a raised temperature of 700–1000° C., Co (cobalt) contained in the cemented carbide is separated from the tool substrate due to the raised temperature so that diamond particles of the diamond coating are graphitized. Such graphitization of the diamond particles undesirably reduces an adhesive or bonding strength with which the diamond coating is bonded to the tool substrate. In the interest of avoiding the separation of the Co from the tool substrate, the tool substrate is commonly subjected to an acid treatment in which Co adjacent to the surface of the substrate is removed by using a suitable acid such as sulfuric acid or nitric acid, prior to the formation of the diamond coating on the substrate. However, where the substrate is made of a super-fine particle cemented carbide having high a Co content, even if Co adjacent to the surface of the substrate has been completely removed from the substrate, Co contained in the substrate comes to the surface of the substrate in a large amount during the heating of the diamond coating. Thus, it is not possible to avoid the reduction in the strength of bonding of the diamond coating to the substrate, making it impossible to use, as the material of the tool substrate, the super-fine particle cemented carbide which inherently has a higher degree of toughness or unbrittleness owing to its high Co content, than the other cemented carbide, and which is advantageously used as the material of the substrate of the cutting tool serving to cut particularly a cast iron or other hard materials.

JP-B2-6-951 (publication of examined Japanese Patent Application laid open in 1994) discloses a diamond-coated body including a substrate, a crystalline diamond coating, an interface layer which is made of TiC or other material, and a layer which has a non-crystalline carbonized structure. In this diamond-coated body, the interface layer is disposed on the substrate, and the non-crystalline carbonized structure layer is disposed on the interface layer so as to be interposed between the interface layer and the diamond coating. This arrangement makes it possible to use, as the material of the substrate, the super-fine particle cemented carbide having a high Co content.

However, in manufacturing the above-described diamond-coated body, it is necessary to implement a step of forming the non-crystalline carbonized structure layer on the interface layer prior to the formation of the crystalline diamond coating. This extra step requires a cumbersome operation, increasing the manufacturing cost.

The above-described drawbacks or problems are encountered not only where the diamond-coated tool takes the form of a cutting tool but also where the diamond-coated tool takes the form of other machining tools such as a cold-forming tool which is designed to form the workpiece into a desired shape by plastically deforming the workpiece.

SUMMARY OF THE INVENTION

It is therefore a first object of the present invention to provide a diamond-coated body in which a diamond coating is fixed to a substrate with a sufficiently high strength even where the substrate is made of a super-fine particle cemented carbide with a high Co (cobalt) content. This first object may be achieved according to any one of first through eleventh aspects of the invention which are described below.

It is a second object of the invention to provide a method of manufacturing a diamond-coated body in which a diamond coating is fixed to a substrate with a sufficiently high strength even where the substrate is made of a super-fine particle cemented carbide with a high Co content. This second object may be achieved according to either of twelfth and thirteenth aspects of the invention which are described below.

The first aspect of this invention provides a diamond-coated body comprising: a substrate made of a cemented carbide; a diamond coating; and an interface layer interposed between the substrate and the diamond coating, wherein the interface layer consists of a solid solution including an aluminum nitride and a metal which belongs to one of groups IVa, Va and VIa of the periodic table. It is noted that the diamond-coated body of the invention can be also interpreted to comprise the above-described substrate, and a multilayer coating which covers the substrate and which includes the above-described diamond coating as its outer layer and the above-described interface layer as its inner layer. In other words, the diamond coating and the interface layer can be also interpreted to cooperate with each other to provide a multilayer coating which covers the substrate. It is further noted that the above-described interface layer can be also referred to as an intermediate layer.

According to the second aspect of the invention, in the diamond-coated body defined in the first aspect of the invention, the diamond coating is held in contact with the interface layer. The crystalline diamond coating is disposed directly on an outer surface of the interface layer, without a layer consisting of a non-crystalline carbonized structure which is conventionally provided to be interposed between the interface layer and the diamond coating, as discussed above in Discussion of the Related Art.

According to the third aspect of the invention, in the diamond-coated body defined in the first or second aspect of the invention, the interface layer includes one of TiAlN (aluminum titanium nitride), CrAlN (aluminum chromium nitride) and VAlN (aluminum vanadium nitride), and is formed on a surface of the substrate in accordance with a physical vapor deposition method. It is noted that TiAlN is interpreted to mean a solid solution including an aluminum nitride and Ti, that CrAlN is interpreted to mean a solid solution including an aluminum nitride and Cr, and that VAlN is interpreted to mean a solid solution including an aluminum nitride and V.

According to the fourth aspect of the invention, in the diamond-coated body defined in any one of the first through third aspects of the invention, the substrate is made of a super-fine particle cemented carbide which includes WC (tungsten carbide) as a main component thereof, the super-fine particle cemented carbide further including Co such that a content of Co therein is 3–25 wt %.

According to the fifth aspect of the invention, in the diamond-coated body defined in the fourth aspect of the invention, the content of Co in the super-fine particle cemented carbide is 5–10 wt %.

According to the sixth aspect of the invention, in the diamond-coated body defined in the fourth aspect of the invention, the super-fine particle cemented carbide includes a hard phase which is provided by particles whose average diameter is not larger than 1 μm.

According to the seventh aspect of the invention, in the diamond-coated body defined in any one of the first through sixth aspects of the invention, the substrate has pits and projections formed on a surface thereof such that the surface of the substrate has a roughness curve whose maximum height Ry is within a range from 0.5 μm to 2 μm.

According to the eighth aspect of the invention, in the diamond-coated body defined in the seventh aspect of the invention, the interface layer is held in contact with the surface of the substrate which has the roughness curve, and wherein the interface layer has a thickness ranging from 0.5 μm to 5 μm.

According to the ninth aspect of the invention, in the diamond-coated body defined in any one of the first through eighth aspects of the invention, the diamond coating has a thickness ranging from 5 μm to 20 μm.

According to the tenth aspect of the invention, in the diamond-coated body defined in any one of the first through ninth aspects of the invention, the diamond-coated body consists of a machining tool which is to be moved relative to a workpiece, for thereby machining the workpiece.

According to the eleventh aspect of the invention, in the diamond-coated body defined in the tenth aspect of the invention, the machining tool consists of an end mill.

The twelfth aspect of the invention provides a method of manufacturing a diamond-coated body comprising (a) a substrate made of a cemented carbide, (b) a diamond coating, and (c) an interface layer interposed between the substrate and the diamond coating, the method comprising: a surface roughening step of roughening a surface of the substrate such that the roughened surface has pits and projections formed thereon; an interface-layer forming step of forming the interface layer out of one of TiAlN, CrAlN and VAlN in accordance with a physical vapor deposition method, such that the interface layer is held in contact in an inner surface thereof with the roughened surface of the substrate having the pits and projections; and a diamond-coating forming step of forming the diamond coating in accordance with a chemical vapor deposition method, such that the diamond coating is held in contact with an outer surface of the interface layer.

According to the thirteenth aspect of the invention, in the method defined in the twelfth aspect of the invention, the surface of the substrate is roughened to have pits and projections such that the surface of the substrate has a predetermined degree of surface roughness, and wherein a thickness of the interface layer is determined on the basis of the predetermined degree of surface roughness of the surface of the substrate such that the pits and projections of the surface of the substrate cause the outer surface of the interface layer to have pits and projections.

In the diamond-coated body defined in any one of the first through eleventh aspects of the invention, the interface layer consists of the solid solution including the aluminum nitride and the metal (e.g., Ti (titanium), Cr (chromium) and V (vanadium)) which belongs to one of the groups IVa, Va and VIa of the periodic table. Owing to the provision of the thus constructed interface layer on the surface of the substrate, the diamond coating can be fixed to the substrate through the interface layer with a sufficiently large adhesive or fixing strength, even in the absence of a layer having a non-crystalline carbonized structure. This arrangement contributes to simplification of the construction of the diamond-coated body and accordingly reduction of the cost of manufacture of the diamond-coated body. It can be assumed that the fixing strength is increased by so-called "droplets", i.e., small pits and projections which are likely to be formed in the outer surface of the interface layer, for example, where the interface layer is formed of TiAlN in accordance with a physical vapor deposition (PVD) method. That is, the small pits and projections are effective to increase an area of the outer surface of the interface layer which can be held in contact with the diamond coating, and to enable the interface layer to be brought into engagement in its pits and projections with the diamond coating.

The interface layer interposed between the substrate and the diamond coating further contributes to prevent Co contained in the substrate from being separated from the substrate during the formation of the diamond coating, avoiding a risk of reduction in the fixing strength with which the diamond coating is fixed to the interface layer and the substrate, and accordingly making it possible to eliminate an acid treatment or other treatment for removing Co from the substrate, prior to the formation of the diamond coating. Namely, the interface layer and the diamond coating can be fixed to the substrate with the sufficiently high fixing strength, not only where the substrate is made of the ordinary cemented carbide but also where the substrate is made of the super-fine particle cemented carbide having a high Co content. Therefore, in the diamond-coated body of the invention, the super-fine particle cemented carbide may be used as a material for forming the substrate. Where a machining tool is provided by the diamond-coated body including the substrate made of the super-fine particle cemented carbide, the machining tool can be advantageously used to machine or cut a workpiece made of a hard material such as a cast iron and an aluminum alloy casting containing high silicon, with its remarkably improved durability owing to a high degree of wear resistance of the diamond coating and a high degree of unbrittleness of the super-fine particle cemented carbide.

The manufacturing method defined in either of the twelfth and thirteen aspects of the invention provides substantially the same technical advantages as the diamond-coated body defined in any one of the first through eleventh aspects of the invention.

The diamond-coated body of the present invention may be a diamond-coated machining tool, such as an end mill, a drill, a tap, a threading die, a replaceable insert which is fixed to a tool holder used for a lathe cutting or milling operation, a cold-forming tool which is designed to form a workpiece into a desired shape by plastically deforming the workpiece, and any other machining tools each of which is to be moved relative to a workpiece for thereby machining the workpiece. In addition, the diamond-coated body of the invention may be other than such machining tools. The machining tool provided by the diamond-coated body of the invention is advantageously used to machine, particularly, a workpiece made of a hard material, and is capable of exhibiting an remarkably improved durability.

The technical advantages of the present invention can be enjoyed, particularly, where the substrate is made of the super-fine particle cemented carbide which has a high Co content. However, the principle of the invention may be applied to the diamond-coated body in which the substrate is made of an ordinary cemented carbide.

The interface layer preferably includes one of TiAlN, CrAlN and VAlN, more preferably includes TiAlN. Where the substrate has the pits and projections formed on its surface, for example, by roughening the substrate surface, the thickness of the interface layer is determined on the basis of the degree of the surface roughness of the substrate surface such that the pits and projections of the substrate surface cause the outer surface of the interface layer to have pits and projections. In this instance, the outer surface of the interface layer does not have to have the same roughness curve as the substrate surface. Namely, the pits and projections of the outer surface of the interface layer does not have to have a profile identical with that of the pits and projections of the substrate surface. The thickness of the interface layer preferably ranges from 0.5 $\mu$m to 5 $\mu$m, while the maximum height Ry of the roughness curve of the substrate surface is preferably within a range from 0.5 $\mu$m to 2 $\mu$m. The thickness of the diamond coating preferably ranges from 5 $\mu$m to 20 $\mu$m, more preferably ranges from 10 $\mu$m to 15 $\mu$m, although the optimum range of the thickness of the diamond coating varies depending upon the material of the interface layer and the surface roughness of the outer surface of the interface layer.

In the surface roughening step in the twelfth aspect of the invention, the substrate surface is roughed, preferably, by an electrolytic polishing or other chemical corrosion treatment, or by a sandblasting with abrasive grains made of SiC or other materials.

In the interface-layer forming step in the twelfth aspect of the invention, the interface layer is formed in accordance with a PVD method such as sputtering method, ion plating method and other vacuum vapor deposition method. However, the interface layer may be formed by other coating method, depending upon the material forming the interface layer.

In the diamond-coating forming step in the twelfth aspect of the invention, the diamond coating is formed, preferably, in accordance with a CVD method such as a microwave plasma CVD method and a hot filament CVD method. However, the diamond-coating forming step may be implemented by using the other method such as a high-frequency plasma CVD method.

BRIEF DESCRIPTION OF THE DRAWINGS

The above and other objects, features, advantages and technical and industrial significance of this invention will be better understood by reading the following detailed description of the presently preferred embodiment of the invention, when considered in connection with the accompanying drawings, in which:

FIG. 4 is a table showing constructions of six end mills of Samples 1–6 used in a durability test which was conducted by the present inventors;

FIG. 5 is a table showing cutting conditions under which the durability test was conducted;

DETAILED DESCRIPTION OF THE PREFERRED EMBODIMENT

Figure 1A:
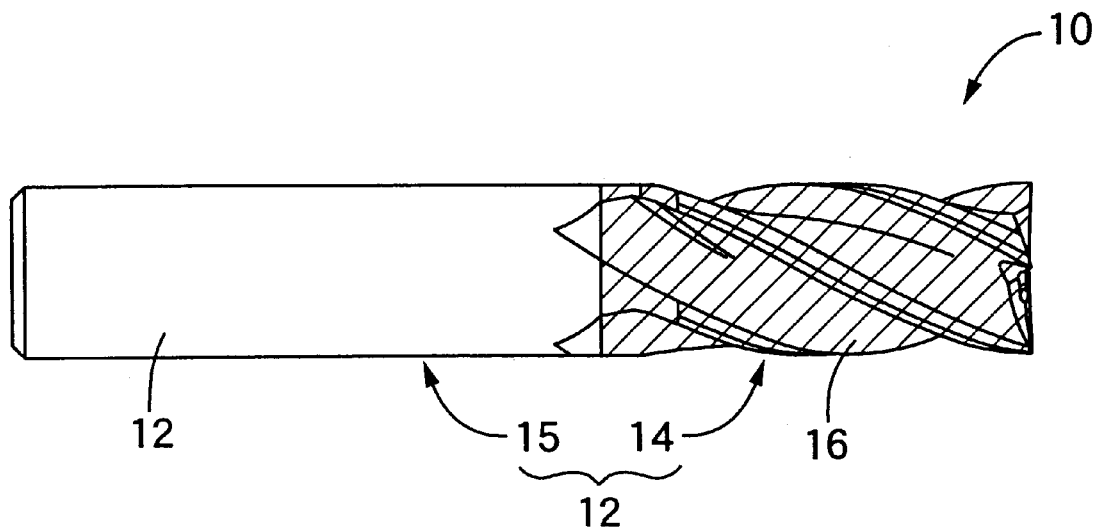
FIG. 1A is an elevational view of a diamond-coated body in the form of an end mill which is constructed according to the present invention.

FIG. 1A is an elevational view of a diamond-coated body in the form of an end mill 10 which is constructed according to this invention. The end mill 10 includes a tool substrate (base material) 12 having a generally cylindrical shape and formed of a super-fine particle cemented carbide which includes WC as its main component and also Co such that a content of Co is 5–10 wt %. The super-fine particle cemented carbide includes a hard phase which is provided by particles having an average diameter or size of not larger than 1 $\mu$m. The tool substrate 12 has a cutting teeth portion 14 and a shank portion 15 which are formed integrally with each other. The cutting teeth portion 14, in which helical flutes and cutting teeth are formed, has a surface that is coated with a diamond coating 16. In FIG. 1A, the oblique-lined portion represents a portion of the surface on which the diamond coating 16 is coated. Each of the cutting teeth has a peripheral flank face, a bottom or end flank face and a rake face which is provided by the corresponding one of the helical flutes, so that a peripheral cutting edge and a bottom or end cutting edge are formed in each cutting tooth. The peripheral cutting edge is defined by an intersection of the rake face and the peripheral flank face, while the end cutting edge is defined by an intersection of the rake face and the end flank face.

Figure 1B:
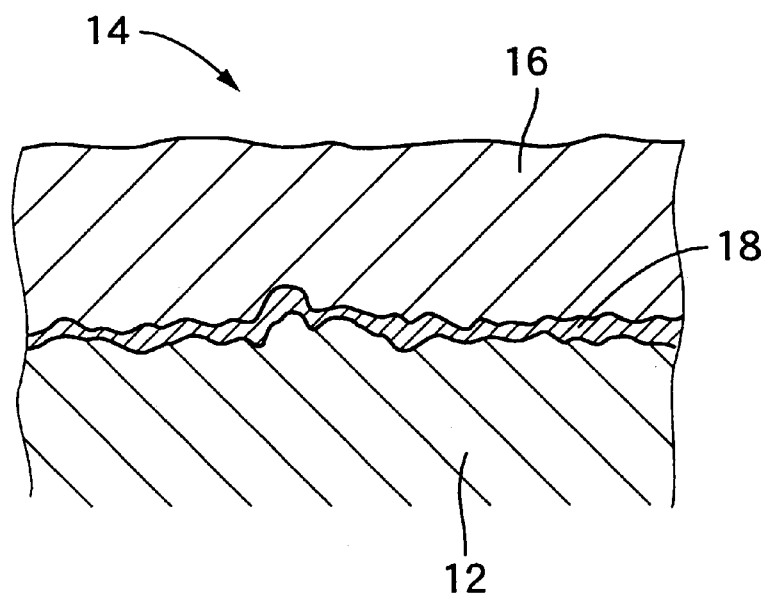
FIG. 1B is a cross sectional view of a cutting teeth portion of the end mill of FIG. 1A, showing an interface layer which is interposed between a diamond coating and a substrate.

The end mill 10 further includes an interface layer 18 which is interposed between the tool substrate 12 and the diamond coating 16. The interface layer 18 is held in contact in its inner and outer surfaces with the tool substrate 12 and the diamond coating 16, respectively, as shown in FIG. 1B which is a cross sectional view of a radially outer portion of the cutting teeth portion 14 of the end mill 10.

Figure 2:
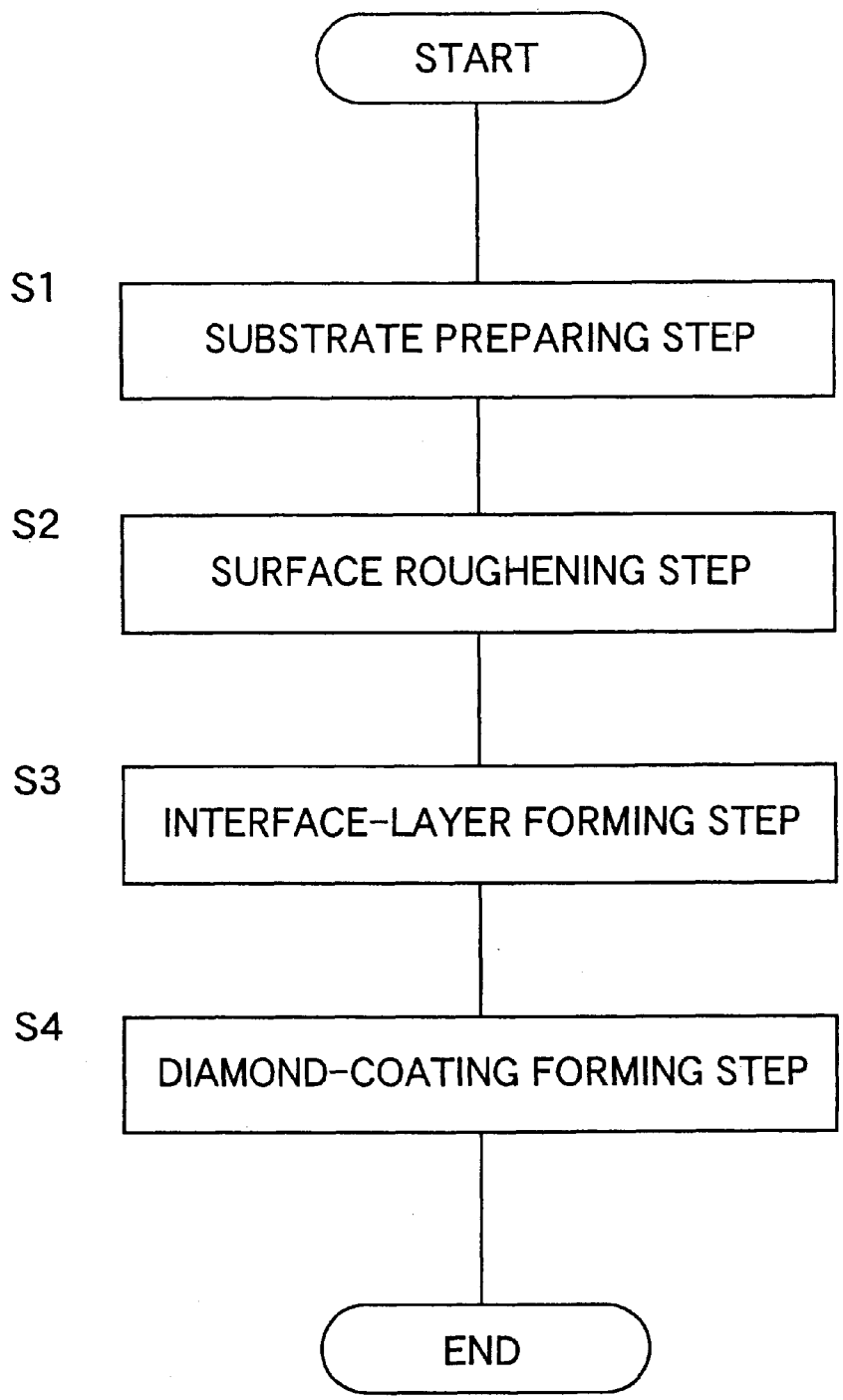
FIG. 2 is a flow chart illustrating a procedure for manufacturing the end mill of FIG. 1A.

FIG. 2 is a flow chart illustrating a procedure for manufacturing the end mill 10. The manufacturing procedure is initiated with a substrate preparing step S1 in which a super-fine particle cemented carbide bar is subjected to a grinding operation and/or other machining operation for forming the tool substrate 12. A surface roughening step S2 is then implemented to roughen the surface of the cutting teeth portion 14 of the tool substrate 12, for increasing a strength with which the interface layer 18 and the diamond coating 16 adhere to or are fixed to the tool substrate 12. This surface roughening step S2 is implemented, for example, by an electrolytic polishing or other chemical corrosion treatment, or by a sandblasting with suitable abrasive grains, such that the roughened surface has a roughness curve whose maximum height Ry is held within a range from 0.5 $\mu$m to 2 $\mu$m.

An interface-layer forming step S3 is then implemented to form the interface layer 18, which is provided by TiAlN, on the roughened surface of the cutting teeth portion 14 of the tool substrate 12 in accordance with an ion plating method or other PVD method, without an acid treatment or other treatment for removing Co from the tool substrate 12. In this instance, the formation of the interface layer 18 is carried out at a raised temperature of 400–500° C. However, this temperature is lower than a temperature of 700–1000° C. at which the formation of the diamond coating is carried out. Further, in the PVD method, the surface of the cutting teeth portion 14 is bombarded with generated ions which collide with the surface of the cutting teeth portion 14. Therefore, in the process of the formation of the interface layer 18, there is no risk of causing separation of Co from the tool substrate 12 to such an extent that would reduce an adhesive or fixing strength with which the interface layer 18 is bonded or fixed to the tool substrate 12. The interface layer 18 is formed such that the interface layer 18 has a predetermined thickness, for example, of about 2–5 μm. The thickness of the interface layer 18 is predetermined on the basis of a degree of the surface roughness of the tool substrate 12 such that the pits and projections formed in the surface of the tool substrate 12 cause the outer surface of the interface layer 18 to have pits and projections which provide a suitable degree of surface roughness, as shown in FIG. 1B.

Figure 3:
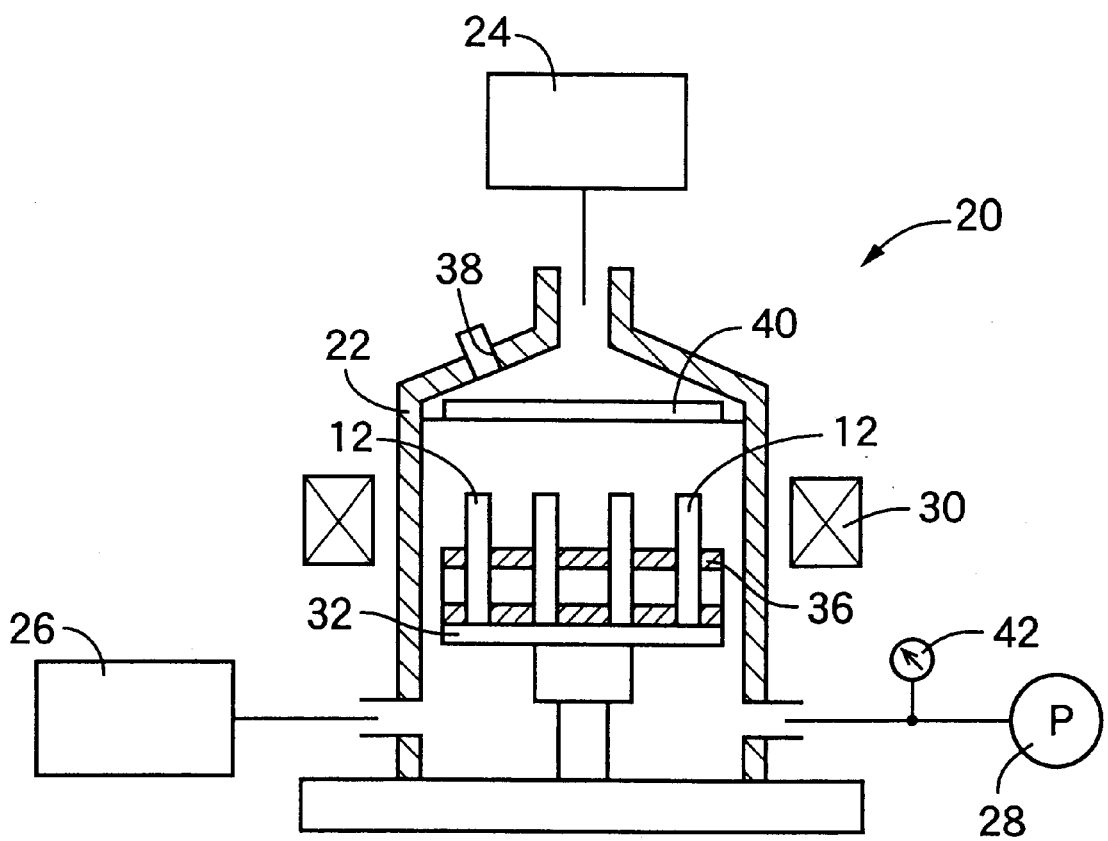
FIG. 3 is a view schematically showing, by way of example, a microwave plasma CVD device which is used in a diamond-coating forming step S4 of the manufacturing procedure of FIG. 2.

The interface-layer forming step S3 is followed by a diamond-coating forming step S4 in which diamond particles are formed and grown on the outer surface of the interface layer 18 by using a microwave plasma CVD device 20 as shown in FIG. 3, so that the interface layer 18 is coated with the diamond coating 16. The diamond coating 16 is formed to have a predetermined thickness, for example, of about 5–15 μm, which enables the diamond coating 16 to have a required degree of wear resistance. The diamond coating 16 is bonded or fixed to the interface layer 18 with a strength increased by the pits and projections and also droplets (relatively small pits and projections) formed on the outer surface of the interface layer 18. That is, the diamond coating 16 is fixed to the interface layer 18 or the tool substrate 12 with the sufficiently strength, without necessity of provision of a layer of a non-crystalline carbonized structure between the interface layer 18 and the diamond coating 16.

The microwave plasma CVD device 20 of FIG. 3 includes a tubular furnace or reactor 22, a microwave generator 24, a gas supplier 26, a vacuum pump 28 and an electromagnetic coil 30. The device 20 further includes a table 32 which is disposed in the tubular reactor 22, and a supporting member 36 which is disposed on the table 32. A plurality of tool substrates 12 are supported by the supporting member 36 such that the cutting teeth portion 14 of each tool substrate 12 which is to be coated with the diamond coating 16 is positioned upwardly of the shank portion 15. The microwave generator 24 serves to generate, for example, a microwave having a frequency of about 2.45 GHz. Each tool substrate 12 is heated with introduction of the microwave into the reactor 22, and a temperature at the surface of the cutting tooth portion 14 of the heated substrate 12 is detected by a radiation thermometer which is provided in an observation window 38 formed through an upper wall of the tubular reactor 22. An electric power supplied to the microwave generator 24 is controlled in a feedback manner, i.e., on the basis of a signal representative of the detected temperature, such that the detected temperature coincides with a predetermined temperature. A silica glass plate 40 is provided in an upper portion of the tubular reactor 22, so that the tool substrates 12 can be observed through the glass plate 40, and a vacuum state within the tubular reactor 22 established by the vacuum pump 28 can be maintained by the glass plate 40.

The gas supplier 26 serves to supply a material gas such as methane ($CH_4$), hydrogen ($H_2$) and carbon monoxide (CO) into the tubular reactor 22. The gas suppliers 26 includes a gas cylinder which is filled with the material gas, a flow control valve which serves to control a flow rate of the material gas, and a flowmeter which serves to measure the flow rate of the material gas. The vacuum pump 28 serves to reduce the pressure in the interior of the reactor 22, by sucking the gas in the interior of the reactor 22. An electric current supplied to the a motor of the vacuum pump 28 is controlled in a feedback manner such that an actual value of the pressure detected by a pressure gage 42 coincides with a predetermined value. The electromagnetic coil 30 consists of an annular mass which is positioned radially outwardly of the tubular reactor 22 so as to surround the outer circumferential surface of the reactor 22.

The diamond-coating forming step S4 consists of a nucleus bonding step and a crystal growing step. In the nucleus bonding step, the flow rates of the methane and hydrogen are controlled to be respective predetermined values, while the microwave generator 24 is controlled such that the temperature at the surface of the tool substrate 12 coincides with a predetermined value which may range from 700° C. to 900° C. Further, the vacuum pump 28 is activated such that the pressure in the reactor 22 coincides with a predetermined value which may range from $2.7 \times 10^2$ Pa to $2.7 \times 10^3$ Pa. The flow rates of the methane and hydrogen, the temperature of the tool substrate 12 and the pressure in the reactor 22 are held in the respective predetermined values for 0.1–2.0 hours, whereby a nucleus layer is bonded to the outer surface of the interface layer 18. It is noted that the term "nucleus layer" used in this specification may be interpreted to mean a layer consisting of an aggregation of a multiplicity of nucleuses.

The nucleus bonding step is followed by the crystal growing step in which the flow rates of the methane and hydrogen are controlled such that the concentration of the methane in the supplied gas coincides with a predetermined value which may range from 1% to 4%. The microwave generator 24 is controlled such that the temperature at the outer surface of the interface layer 18 coincides with a predetermined value which may range from 800° C. to 900° C. The vacuum pump 28 is activated such that the pressure in the reactor 22 coincides with a predetermined value which may range from $1.3 \times 10^3$ Pa to $6.7 \times 10^3$ Pa. The concentration of the methane, the temperature of the outer surface of the interface layer 18 and the pressure in the tubular reactor 22 are held in the respective predetermined values for a predetermined time, whereby the diamond crystals are grown from the nucleus layer, for forming the diamond coating 16 having a predetermined thickness. It is noted that the diamond coating 16 can be adapted to consist of a plurality of layers each formed of grown diamond crystallites, by repeatedly implementing the nucleus bonding step and the crystal growing step.

In the end mill 10 manufactured as described above, the interface layer 18 consisting of TiAlN is provided to be disposed on the roughened surface of the tool substrate 12, and the interface layer 18 is coated with the diamond coating 16. Owing to the provision of the interface layer 18 on the surface of the tool substrate 12, the diamond coating 16 can be fixed to the tool substrate 12 through the interface layer 18 with a sufficiently large fixing strength, in spite of the absence of a layer consisting of a non-crystalline carbonized structure. This arrangement contributes to simplification of the construction of the end mill 10 and accordingly reduction of the cost of manufacture of the end mill 10. It can be assumed that the fixing strength is increased owing to what are called "droplets", i.e., small pits and projections which are likely to be formed in the outer surface of the interface layer 18, for example, where the interface layer 18 is formed of TiAlN in accordance with a physical vapor deposition (PVD) method. That is, the droplets cooperate with the roughened surface of the tool substrate 12, for increasing an area of the outer surface of the interface layer 18 which can be held in contact with the diamond coating 16 and for enabling the interface layer 18 to mesh in its pits and projections with the diamond coating 16.

The interface layer 18 interposed between the tool substrate 12 and the diamond coating 16 further contributes to prevent Co, contained in the tool substrate 12, from being separated from the tool substrate 12 during the formations of the interface layer 18 and the diamond coating 16, avoiding a risk of reduction in the fixing strength with which the diamond coating 16 is fixed to the interface layer 18 and the tool substrate 12, and accordingly making it possible to eliminate an acid treatment or other treatment for removing Co from the tool substrate 12, prior to the formation of the diamond coating 16. Namely, the interface layer 18 and the diamond coating 16 can be fixed to the tool substrate 12 with the sufficiently high fixing strength, not only where the tool substrate 12 is made of the ordinary cemented carbide but also where the tool substrate 12 is made of the super-fine particle cemented carbide having a high Co content. Therefore, in the end mill 10 constructed according to the invention, the super-fine particle cemented carbide can be used as a material for forming the tool substrate 12, so that the end mill 10 can be advantageously used to machine or cut a workpiece made of a hard material such as a cast iron and an aluminum alloy casting containing high silicon, with its remarkably improved durability owing to a high degree of wear resistance of the diamond coating 16 and a high degree of unbrittleness of the tool substrate 12 formed of the super-fine particle cemented carbide.

For confirming the technical advantages provided by the invention, particularly, the improvement in the durability of the machining tool of the invention, a test was conducted by using six end mills each having two cutting teeth and a construction as specified in the table of FIG. 4. The six end mills were: Samples 1–4 each of which was constructed according to the invention; and Samples 5, 6 each of which did not include an interface layer.

As is apparent from the table of FIG. 4, each of Samples 1, 2 and 6 had a tool substrate formed of a super-fine particle cemented carbide, while each of Samples 3, 4 and 5 had a tool substrate formed of an ordinary cemented carbide. Each of Samples 1–4 included a diamond coating and an interface layer which was interposed between the tool substrate and the diamond coating and which was formed of TiAlN, while each of Samples 5 and 6 did not include an interface layer so that the diamond coating was disposed directly on the tool substrate. In each of Samples 1–4, the surface of the tool substrate was roughed by an electrolytic polishing or a sandblasting with abrasive grains made of SiC, prior to the formations of the interface layer and the diamond coating. In each of Samples 5 and 6, the surface of the tool substrate was roughed by an electrolytic polishing and then subjected to an acid treatment for removing Co from the tool substrate, prior to the formation of the diamond coating. The thickness of the diamond coating of each of Samples 1–3, 5 and 6 was 10 $\mu$m, while that of Sample 4 was 14 $\mu$m. The diameter of the cutting teeth portion of each of Samples 1–6 was 10 mm.

There were used two workpieces one of which was made of A7075 (aluminum) and the other of which was made of ADC12 (aluminum die cast). The two workpieces were cut by each Sample under cutting conditions as indicated by the table of FIG. 5. "$a_a$" and "$a_r$" in the column of "DEPTH OF CUT" in the table represent a depth of cut as viewed in the axial direction of the end mill and a depth of cut as viewed in the radial direction of the end mill, respectively. "D" therein represents the diameter of the cutting teeth portion of each end mill. "FEED RATE" therein represents a feed per tooth [–(feed per minute)/(number of revolutions per minute)×(number of teeth in tool)]. During each cutting, the feed was incrementally increased in increments of 0.025 mm/tooth.

Figure 6:
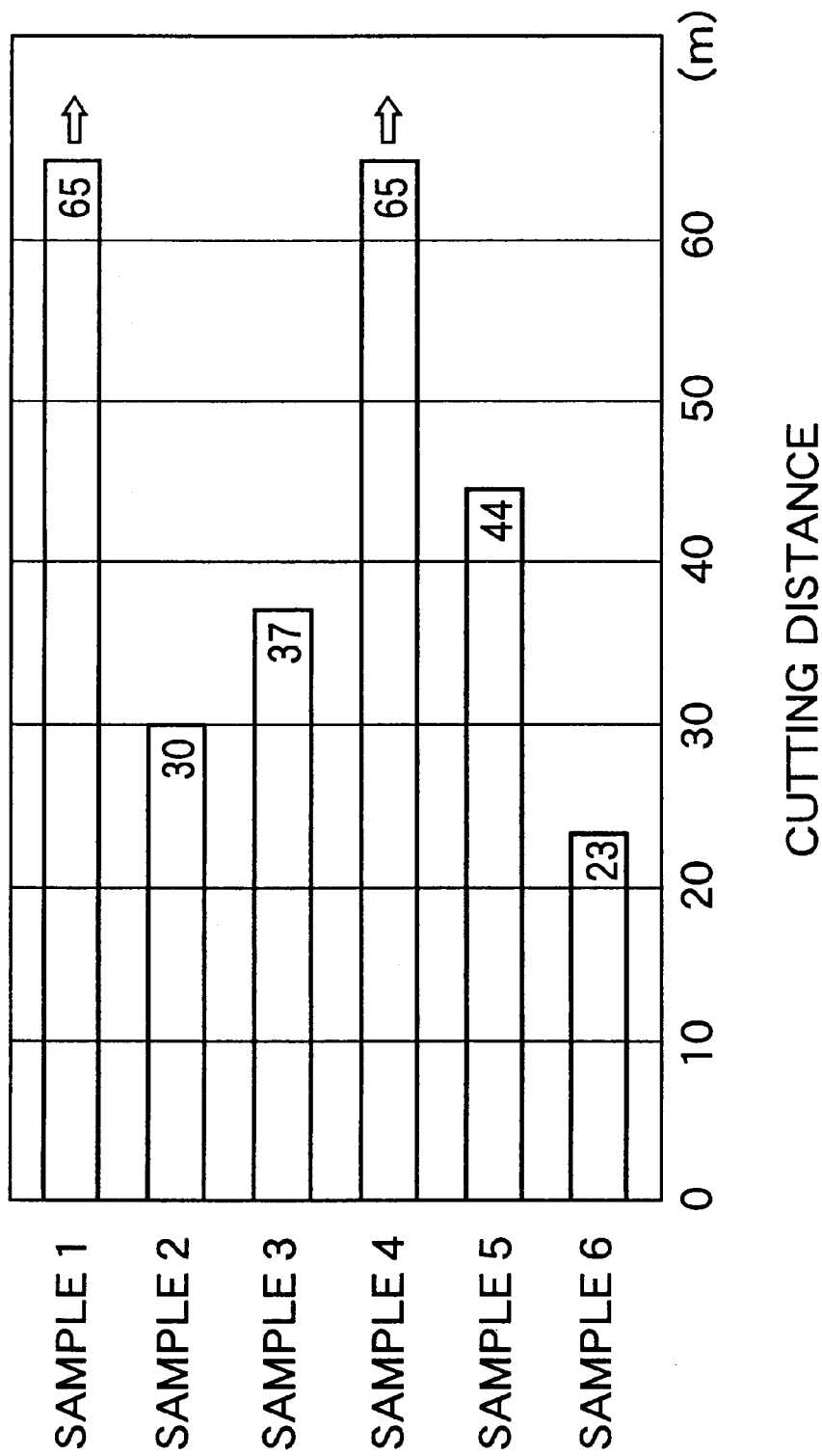
FIG. 6 is a graph showing a result of the durability test.

In the test, firstly, a side face of the workpiece of A7075 was cut over a distance of 4.2 m by each Sample. Secondly, a slot was cut in the same workpiece over a distance of 4.8 m by each Sample. Even after the side face cutting and the slot cutting, no damage was found in any one of Samples 1–6. Lastly, a side face of the workpiece of ADC12 was cut by each Sample. In this cutting of the side face of ADC12, Samples 1 and 4 did not yet suffer from any damage during the cutting over a distance of 65 m, while Samples 2, 3, 5 and 6 could no longer continue their cutting operations after accumulative distances, over which the side face of ADC12 had been cut by these Samples, ran up to the respective amounts as indicated by the graph of FIG. 6. That is, Samples 1 and 4 remained still serviceable even after the cutting of the side face of ADC12 through the distance of 65 m, while Samples 2, 3, 5 and 6 became unserviceable due to removals of the diamond coatings from the tool substrates when the above-described accumulative distances of Samples 2, 3, 5 and 6 amounted to 30 m, 37 m, 44 m and 23 m, respectively, as indicated by the graph of FIG. 6.

As is apparent from the graph of FIG. 6, Sample 1 constructed according to the present invention exhibited a durability that was improved by at least about 50% over that of Sample 5 in which the ordinary cemented carbide substrate was subjected to the Co removing treatment (acid treatment) and then coated with the diamond coating. This result revealed that the provision of the interface layer is effective to bond or fix to the tool substrate with a sufficiently high strength even where the substrate is made of the super-fine particle cemented carbide. Further, as is clear from the performances exhibited by Samples 3 and 4, it was revealed that a suitable thickness of the diamond coating is effective to further improve the service life of the tool.

Figure 7A:
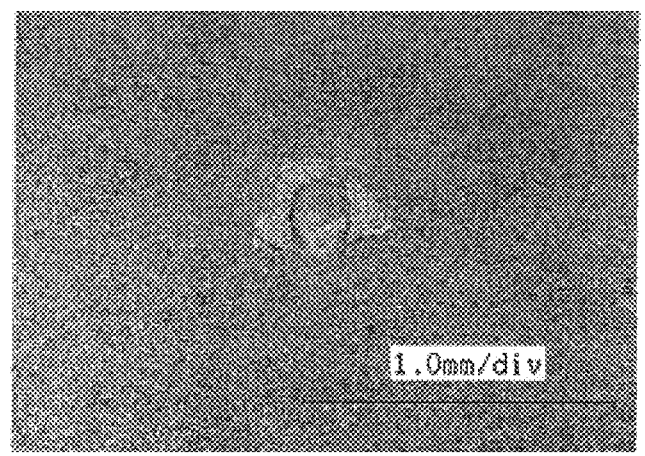
FIGS. 7A and 7B are photographs showing impressions formed on respective surfaces of Samples 1 and 5 after a diamond identator has been forced onto the surfaces with a predetermined load.
Figure 7B:
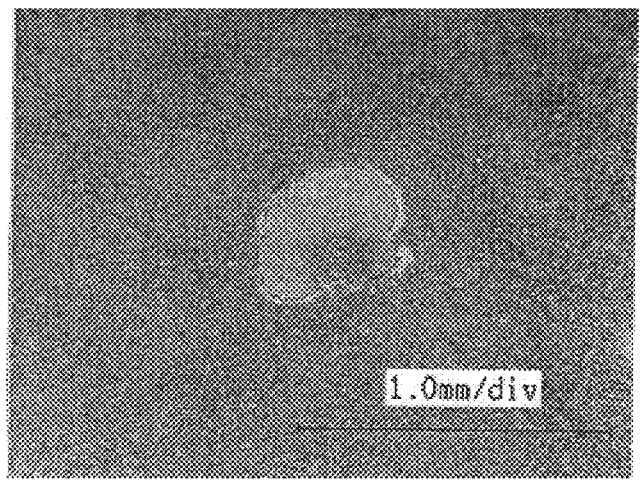

Another test was conducted to Samples 1 and 5, by using a Rockwell hardness test device as defined in JIS Z 2245. In this test, a diamond indentator was forced onto a surface of each of Samples 1 and 5, with a test load of 588.4 N applied to the diamond identator. FIGS. 7A and 7B are photographs showing impressions or indentations which result in local removals of diamond coatings of Samples 1 and 5, respectively, after the diamond indentator was forced onto the surfaces of these Samples. As is apparent from these figures, the indentation formed on the surface of Sample 1 was smaller than that formed on the surface of Sample 5. That is, Sample 1 exhibited a higher fixing strength of the diamond coating to the tool substrate, than that of Sample 5.

While the presently preferred embodiment of the present invention has been illustrated above, it is to be understood that the invention is not limited to the details of the illustrated embodiment, but may be embodied with various other changes, modifications and improvements, which may occur to those skilled in the art, without departing from the spirit and scope of the invention defined in the following claims.

What is claimed is:

1. A diamond-coated body comprising:

a substrate formed of a cemented carbide;

a diamond coating; and an interface layer interposed between said substrate and said diamond coating, wherein said interface layer consists of a solid solution including an aluminum nitride and a metal which belongs to one of Groups IVA, VA and VIA of the periodic table, and wherein said diamond coating is held in contact with said interface layer.

2. A diamond-coated body according to claim 1, wherein said interface layer is formed on a surface of said substrate in accordance with a physical vapor deposition method, said interface layer being provided by one of TiAlN, CrAlN and VAlN.

3. A diamond-coated body according to claim 1, wherein said substrate is formed of a super-fine particle cemented carbide which includes WC as a main component thereof, said super-fine particle cemented carbide further including Co such that a content of Co therein is 3–25 wt %.

4. A diamond-coated body according to claim 3, wherein said content of Co in said super-fine particle cemented carbide is 5–10 wt %.

5. A diamond-coated body according to claim 3, wherein said super-fine particle cemented carbide includes a hard phase which is provided by particles having an average size of not larger than 1 μm.

6. A diamond-coated body according to claim 1, wherein said substrate has pits and projections formed on a surface thereof such that said surface of said substrate has a roughness curve whose maximum height Ry is within a range from 0.5 μm to 2 μm.

7. A diamond-coated body according to claim 6, wherein said interface layer is held in contact with said surface of said substrate which has said roughness curve, and wherein said interface layer has a thickness ranging from 0.5 μm to 5 μm.

8. A diamond-coated body according to claim 1, wherein said diamond coating has a thickness ranging from 5 μm to 20 μm.

9. A diamond-coated body according to claim 1, wherein said interface layer is held in contact with said substrate.

* * * * *